(12) United States Patent
Lehobey et al.

(10) Patent No.: US 7,120,850 B2
(45) Date of Patent: Oct. 10, 2006

(54) LOW-COST METHODS AND DEVICES FOR THE DECODING OF PRODUCT CASES

(75) Inventors: Frédéric Lehobey, Rennes (FR); Philippe Piret, Cesson-Sevigne (FR)

(73) Assignee: Canon Kabushiki Kaisha, Tokyo (JP)

( * ) Notice: Subject to any disclaimer, the term of this patent is extended or adjusted under 35 U.S.C. 154(b) by 456 days.

(21) Appl. No.: 10/408,458

(22) Filed: Apr. 8, 2003

(65) Prior Publication Data

US 2004/0039978 A1    Feb. 26, 2004

(30) Foreign Application Priority Data

Apr. 12, 2002   (FR) .................... 02 04646

(51) Int. Cl.
    H03M 13/00    (2006.01)
(52) U.S. Cl. ................ 714/755; 714/759; 714/763; 714/784
(58) Field of Classification Search ................ 714/755, 714/759, 763, 784
    See application file for complete search history.

(56) References Cited

U.S. PATENT DOCUMENTS

| | | | |
|---|---|---|---|
| 4,646,301 A | 2/1987 | Okamoto et al. ............. 371/37 |
| 4,785,451 A * | 11/1988 | Sako et al. ................ 714/756 |
| 5,541,939 A * | 7/1996 | Im ............................ 714/765 |
| 5,719,884 A * | 2/1998 | Roth et al. .................. 714/755 |
| 6,028,927 A | 2/2000 | Delumeau et al. .......... 379/386 |
| 6,047,395 A | 4/2000 | Zook .......................... 714/756 |
| 6,138,263 A | 10/2000 | Kodama .................... 714/769 |
| 6,363,511 B1 * | 3/2002 | Massoudi ................... 714/755 |
| 6,810,499 B1 * | 10/2004 | Sridharan et al. ........... 714/755 |
| 2001/0009030 A1 | 7/2001 | Piret et al. .................. 714/790 |

FOREIGN PATENT DOCUMENTS

| | | |
|---|---|---|
| EP | 1 089 568 | 9/2000 |
| EP | 1 170 954 | 3/2001 |
| FR | 2 789 824 | 12/1999 |

OTHER PUBLICATIONS

Pretzel, Oliver, "Partial Geometric Codes," IEEE Transactions On Information Theory, vol. 45, No. 7, Nov. 1999.

Hoboldt, T. and Pellikaan, R., "On the Decoding of Algebraic-Geometric Codes," IEEE Trans. On Information Theory, vol. 41, No. 6. Nov. 1995.

(Continued)

Primary Examiner—Guy Lamarre
Assistant Examiner—Esaw Abraham
(74) Attorney, Agent, or Firm—Fitzpatrick, Cella, Harper & Scinto

(57) ABSTRACT

A method of decoding product codes is disclosed, in which the symbols of each codeword may be placed in a table comprising $n_2$ rows and $n_1$ columns, such that the symbols constituting each row form a permitted word of length $n_1$ according to a first component code able to be decoded by means of an algorithm $A_1$ for correction with erasures, and the symbols constituting each column form a permitted word of length $n_2$ according to a second component code able to be decoded by means of an algorithm $A_2$ for correction with erasures. According to the method, a correction of a row or column is only accepted when the result of the correction is deemed reliable, otherwise all the symbols of that row or column are erased. Devices and apparatus adapted to implement this method are also disclosed. The method is preferably applied to algebraic geometric codes.

12 Claims, 7 Drawing Sheets

OTHER PUBLICATIONS

"Algebraic Geometric Codes," Van Lint, J., "Coding Theory and Design Theory," 1st part, IMA Volume Math. Appl., vol. 21, Springer and Verlag, Berlin, 1990.

Skorobogatov, A. and Vladut, S. "On the Decoding of Algebraic-Geometric Codes," IEEE Trans. Inform. Theory, vol. 36, No. 5, pp. 1051-1060, Nov. 1990.

S. Sakata, Symbolic Computing, vol. 5, pp. 321-337, 1988.

"Improved Geometric Goppa Codes," Feng, G., Rao, T., and Welch, L., 1994 IEEE International Symposium on Information Theory, Trondheim Norway, p. 152.

"Improved Geometric Goppa Codes, Part I: Basic Theory," Feng, G., and Rao, T., IEEE Transactions on Information Theory, Nov. 1995, pp. 1678-1693.

"A Normalized Rate-Distortion Model For H.263-Compatible Codecs And Its Application To Quantizer Selection," Yang, K., Proceedings, International Conference On Image Processing, Santa Barbara, California, Oct. 26, 1997, pp. 41-44.

"Rate Control And Low-Delay Video Communication," ITU Telecommunications Standardization Sector, Jun. 24, 1997, pp. 1-27.

"Rationality Of Restricted Re-Quantization For Efficient MPEG Transcoding," Kadono, S. et al, Proceedings, 2000 International Conference On Image Processing, Sep. 1-13, 2000, pp. 952-955.

"Error-Resilient Transcoding For Video Over Wireless Channels," De Los Reyes, G., et al., IEEE Journal On Selected Areas In Communications, Jun. 2000, pp. 1063-1074.

"A New Content-Based Hybrid Video Transcoding Method," Yongqing, L., et al., Proceedings, 2001 International Conference On Image Processing, Thessaloniki, Greece, Oct. 7, 2001, pp. 429-432.

S. Sakata, Informat. Computing., vol. 84, pp. 207-239, 1990.

\* cited by examiner

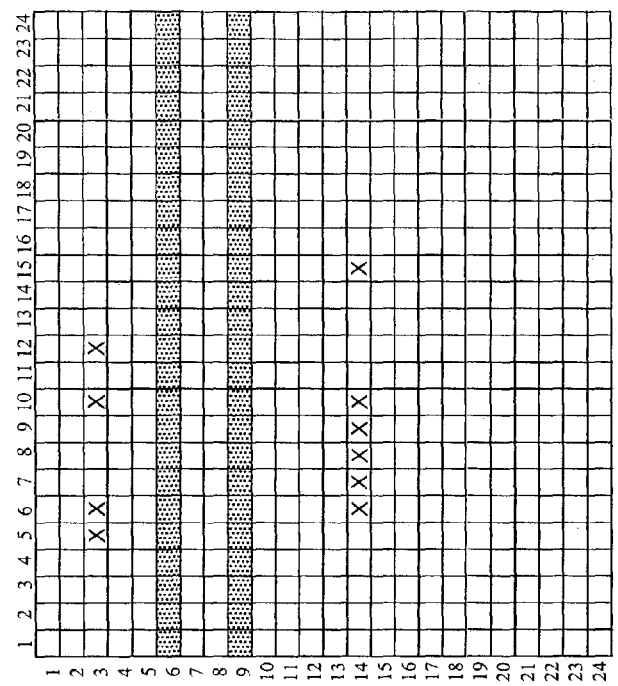
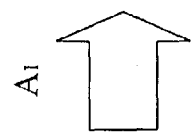
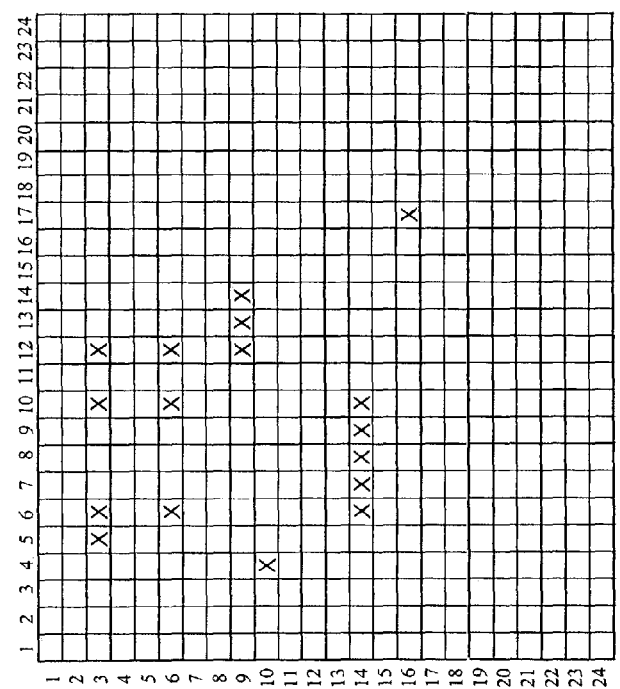
FIG. 4b
FIG. 4a

LOW-COST METHODS AND DEVICES FOR THE DECODING OF PRODUCT CASES

BACKGROUND OF THE INVENTION

1. Field of the Invention

The present invention concerns communication systems in which, in order to improve the fidelity of the transmission, the data to be transmitted are subjected to a channel encoding. It concerns more particularly a decoding method, as well as the devices and apparatus adapted to implement this method.

2. Description of the Related Art

It will be recalled that so-called "channel" encoding consists, when the "codewords" sent to the receiver are formed, of introducing a certain amount of redundancy in the data to be transmitted. More particularly, by means of each codeword, a predetermined number k of information symbols are transmitted which are chosen from a predetermined "alphabet" of finite size; to these k information symbols are added a number (n−k) of so-called "parity" symbols, taken from the same alphabet, so as to form codewords of length n; the set rules for calculation of the parity symbols as a function of information symbols defines a "code", or "encoding method", of parameters (n,k).

At the receiver, the associated decoding method then judiciously uses this redundancy to detect any transmission errors and if possible to correct them. More particularly, the decoding is carried out in two main steps.

The first step consists of associating an "associated codeword" with the received word. To do this, the decoder first analyzes the received word to verify whether it belongs to the code. If that is the case, it is assumed that no transmission error has occurred, and said "associated codeword" will simply be identical to the received word. If that is not the case, it is thereby deduced that some symbols in the received word are erroneous, and a correction algorithm is then implemented which is adapted to replace some of the received symbols with other symbols of the same alphabet, such that the result is a codeword, which will then constitute said "associated codeword".

The second step simply consists in reversing the encoding method, that is to say in removing the redundant symbols from the "associated codeword" to retrieve the initial data.

More particularly, the invention concerns the first of these two steps and the conditions for implementation of said correction algorithms. The role of these is usually to associate with the received word the codeword situated at the shortest Hamming distance from this received word, the "Hamming distance" being, by definition, the number of places where two words of the same length have a different symbol. Each code thus provides an error correction capacity which is limited by the smallest Hamming distance between any two words of the code, which is referred to as the "minimum distance" of the code d; more specifically, when the chosen correction algorithm is required to find the position of possible errors in any received word, and to provide a replacement symbol for each of these positions, the capacity to correct at best $INT[(d-1)/2]$ errors can be ensured for a code of minimum distance d ("INT" designates the integer part); if the received word contains a number of errors strictly greater than $INT[(d-1)/2]$, the algorithm will in certain cases be able to propose a correction, but it will then of course be very uncertain that this correction will be the right one, that is to say that the associated codeword is really the codeword sent by the transmitter.

Certain of the encoding methods typically used, for example in CD (compact disc) and DVD (digital video disc) recordings, are "product codes". In these methods, the symbols of each codeword may be placed in a table comprising $n_1$ rows and $n_2$ columns, such that the symbols constituting each row form a word belonging to a first "component" code $(n_1,k_1)$, and the symbols constituting each column form a word belonging to a second component code $(n_2,k_2)$. It is easy to understand that such product codes are advantageous: for example, if it is found that in a received word, a certain row does not belong to the first code and a certain column does not belong to the second code, it is immediately deduced from this, on the assumption that a single received symbol is tainted by error, that this erroneous symbol is situated at the crossing point of said row and said column. Another great advantage is that correction of all the errors of the received word may be achieved even if it may be initially impossible to correct certain of its rows with the algorithm associated with the first code, and/or initially impossible to correct certain of its columns with the algorithm associated with the second code. this is because the iterative correction of the rows one after the other, then of the columns one after the other, then the rows again, and so forth as necessary, may very well succeed in progressively reducing the number of errors, such that, at a certain stage, this number may fall in each row within the correction capacity of the first algorithm and in each column within the correction capacity of the second algorithm.

U.S. Pat. Nos. 6,047,395 and 6,138,263, for example, disclose methods of decoding a product code. These methods comprise a step consisting, when the first (respectively second) algorithm is unable to propose a correction for a row (respectively column) under consideration, of "erasing" the whole of said row (respectively column): this means that, when it is then sought to correct the columns (respectively rows), the positions whose symbols have been "erased" are signaled to the second (respectively first) algorithm. This is because, in general terms, when an algorithm has to correct a word (in the present case a row or column), the fact of knowing in advance the positions containing doubtful symbols considerably facilitates the algorithm's task; more particularly, it is known that an algorithm capable of taking this information into account has, if only words comprising erasures are submitted to it, a reliable correction limit twice that which it has if only words containing errors of unknown position are submitted to it. These methods of decoding product codes with erasure of uncorrectable rows and columns thus makes it possible both to tolerate a greater number of transmission errors, and to accelerate the correction procedure of these errors.

Even though such decoding methods have certain advantages, they have the drawback of giving rise to a relatively high rate of false corrections. This is because each time a row or column is erased, any information about the word which could have remained in that row or that column despite the transmission errors which that row or column has undergone, is of course lost. Consequently, if it is nevertheless desired to achieve true correction of this word, it is necessary to have a sufficient number of reliable symbols in the positions not erased of the table. However, the fact of accepting the "correction" supplied by the algorithms each time they are able to supply a "correction" means that often, when the number of errors in a row or column submitted to the row or column algorithm is relatively high, a new row or column will be entered, which is in fact tainted with errors (without this having been realized), due to the fact that the algorithm was able to propose an apparently corrected word by modifying a relatively small number of symbols, of which at least one was correct. An increasing number of false symbols will thus be generated during the subsequent steps of "correcting" this word, and in these circumstances, a highly erroneous "associated codeword" will generally result.

SUMMARY OF THE INVENTION

In order to solve this problem, the invention concerns, according to a first aspect, a method of decoding a product code, in which the symbols of each codeword may be placed in a table comprising $n_2$ rows and $n_1$ columns, such that the symbols constituting each row form a permitted word of length $n_1$ according to a first component code able to be decoded by means of an algorithm $A_1$ for correction with erasures, and the symbols constituting each column form a permitted word of length $n_2$ according to a second component code able to be decoded by means of an algorithm $A_2$ for correction with erasures, said method being remarkable in that it comprises a succession of main steps which are implemented until the correction of the received word is complete, each of these steps consisting in processing either a row or a column of said table in a predetermined order, and in that it comprises, to process a row $i (1 \leq i \leq n_2)$:

a) applying the algorithm $A_1$ to the row i taking into account the $\tau_1^i$ erased positions (if any), b) if the algorithm $A_1$ is unable to correct the row, erasing all the symbols of that row, c) if the algorithm $A_1$ is able to correct the row, determining whether the result of this correction is reliable and,
if the result is deemed reliable, accepting said correction,
if the result is not deemed reliable, erasing all the symbols of that row, and in that it comprises, to process a column $j (1 \leq j \leq n_1)$:

d) applying the algorithm $A_2$ to the column j taking into account the $\tau_2^j$ erased positions (if any), e) if the algorithm $A_2$ is unable to correct the column, erasing all the symbols of that column, f) if the algorithm $A_2$ is able to correct the column, determining whether the result of this correction is reliable and,
if the result is deemed reliable, accepting said correction,
if the result is not deemed reliable, erasing all the symbols of that column.

Thus, according to the invention, the correction of a row or column is only accepted when the correction algorithm was not pushed beyond its real capacities, so that the correction provided is reliable. Hence, the above-mentioned advantages of the technique of decoding product codes with erasures are benefited from, but in addition, by virtue of the invention, the rate of erroneous corrections is considerably reduced.

In one embodiment, in steps c) and f), one counts the number of symbols t whose value has been changed during the correction in the row or the column to be corrected and of which it was not known in advance that they were to be corrected (that is to say, they were not in erased positions), and one determines whether the result of the correction is reliable on the basis of the value of t and of the number $\tau$ of erased symbols in this row or column.

It should be noted that this number t does not always coincide with the real number of erroneous symbols (that is to say, that are different to those transmitted) in the row or column under consideration: this is because it may occasionally happen that the algorithm proposes a "corrected" row or column which is in fact erroneous, by changing the value of the symbols which were in fact correct, and/or by keeping erroneous symbols which it has not found at that step of the decoding.

In this connection, the creators of the present invention have realized that, when it is sought to estimate whether a correction proposed by a row or column algorithm has a good chance of being a true one (instead of being a false correction), the natural quantity to be considered is the number $(2t+\tau)$.

Hence, in a particular choice within the above-mentioned embodiment, the decoding method comprises
in step c), counting the number $t_1^i$ of symbols whose value has been changed during step a), then calculating the value $(2t_1^i + \tau_1^i)$, and
if $(2t_1^i + \tau_1^i) \leq d^*_1$, where $d^*_1$ is a predetermined positive integer, accepting the correction, and
if $(2t_1^i + \tau_1^i) > d^*_1$, erasing all the symbols of that row, and
in step f), counting the number $t_2^j$ of symbols whose value has been changed during step d), then calculating the value $(2t_2^j + \tau_2^j)$, and
if $(2t_2^j + \tau_2^j) \leq d^*_2$, where $d^*_2$ is a predetermined positive integer, accepting the correction, and
if $(2t_2^j + \tau_2^j) > d^*_2$, erasing all the symbols of that column.

By means of the above criterion, it is ensured that the correction of a row or column is only accepted when the number of symbols whose value has been, after applying an algorithm, either changed or determined, proves to be reasonably small. Clearly, the parameter d* plays the role of a "reliability limit".

In other words, according to this criterion, it is considered that the capacity of a correction algorithm to be able to propose a correction of a received word in all cases (that is to say whatever the received word), is faithfully represented by the formula:

$$(2t+\tau) \leq \Delta,$$

where $\Delta$ is a strictly positive integer which we will call the "solving capability" of the algorithm (an error correction algorithm must in particular be able to solve a certain number of equations resulting from the "error syndromes"). If the value of $(2t+\tau)$ is greater than this solving capability $\Delta$, the algorithm can:
either fail purely and simply in its correction attempt,
or be capable of proposing a correction of the received word; in this case, if that correction is accepted, the risk is taken of it being erroneous, i.e. that the codeword proposed is not in fact the word sent, and clearly the greater $(2t+\tau)$ is with respect to $\Delta$, the higher is this risk.

Taking account of the considerations presented in the introduction concerning the minimum distance d of the code to which this algorithm is applied, it will be stated that the algorithm considered is "maximal" if $$\Delta = d-1,$$

and "sub-maximal" if $$\Delta < d-1.$$

According to a preferred feature of the invention, the algorithm $A_1$ associated with the row code and/or the algorithm $A_2$ associated with the column code is a sub-maximal algorithm (when one exists). This feature is particularly advantageous in the case where there is known, for the same code, both an algorithm that is maximal, or just "slightly sub-maximal" ($\Delta$ close to $(d-1)$ while still being less than it), and an algorithm that is "substantially sub-maximal" ($\Delta$ much less than $(d-1)$), the latter being faster and/or simpler to execute than the former. It the sub-maximal algorithm with erasures according to the invention is then chosen instead of the maximal algorithm without erasures, the decoding will be faster and/or simpler to implement, without losing out significantly in terms of reliability on account of this, i.e. without significantly increasing the rate of erroneous corrections of the received words.

This is because the correction failures of the "substantially sub-maximal" algorithm are not, in the context of the decoding of a product code according to the invention, synonymous with total loss of information: in a way, the erasures constitute "soft information" consisting of indicating to the algorithm, in view of the later processing steps of the word, which positions in the word are less reliable than the others; thus this algorithm can, by taking advantage of that "soft information", compensate for its inferiority in terms of performance with respect to a more complex algorithm, and thus become highly advantageous, precisely because it is relatively simple to implement.

Before implementing the invention in a particular application, it is recommended to carry out tests to determine the best possible value for the reliability limit d*. In that respect, the value of the solving capability $\Delta$ can usefully serve as a reference. Generally, two situations may be distinguished:

either the algorithm chosen is maximal, or just "slightly sub-maximal": d* will then preferably be quite a lot less than $\Delta$;

or the algorithm chosen is "substantially sub-maximal": d* will then preferably equal to, or even slightly greater than $\Delta$.

According to particular features, the value of $d^*_1$ and/or $d^*_2$ is made to vary during the decoding of a received word. Preferably these values will be made to increase progressively in order to benefit from the fact that the decoding procedure progressively corrects the errors contained in the received word, and that, consequently, there is less and less risk that a correction proposed by the algorithm will be erroneous.

U.S. Pat. Nos. 6,047,395 and 6,138,263 mentioned above are directed in particular to applications in which the row code and the column code are both "Reed-Solomon codes". Reed-Solomon codes are very efficient, but become unwieldy when the size of the alphabet exceeds 256; for a product code built on the basis of two such Reed-Solomon codes, a length n is reasonably obtained equal to more than $256^2$, i.e. 65536.

However, in modern information carriers, it is sought to increase information density. Due to this, when such a carrier is affected by a physical defect such as a scratch, a high number of information symbols may be rendered unreadable. This problem may nevertheless be remedied using very long codewords. This is why it has been sought to construct codes that naturally offer a greater length than the Reed-Solomon codes, and by making up such codes, very long product codes may be constructed.

In particular so-called "algebraic geometric codes" or "Goppa geometric codes" have recently been proposed (see for example "*Algebraic Geometric Codes*" by par J. H. van Lint, in "*Coding Theory and Design Theory*" $1^{st}$ part, *IMA Volumes Math. Appl.*, volume 21, Springer-Verlag, Berlin, 1990). These codes are constructed from algebraic curves defined on the basis of an alphabet of q elements structured into a Galois field. An important parameter of such a curve is its "genus" g. In the particular case where the curve is a simple straight line (the genus g is then nil), the algebraic geometric code reduces to a Reed-Solomon code. Algebraic geometric codes make it possible to achieve a length equal to $(q+2g\sqrt{q})$, which may be very high; for example, with two component codes each having an alphabet length of 256 and a genus equal to 120, words of product code are obtained of length 16 777 216.

According to particular features of the invention, the row and/or column code is an algebraic geometric code.

Algebraic geometric codes are, as has been said, advantageous as to the length of the codewords, but they have the drawback of requiring (on the basis of current knowledge at least) decoding algorithms that are rather complex, and thus rather expensive in terms of equipment (software and/or hardware) and processing time. This complexity is in fact greater or lesser according to the algorithm considered, a greater complexity being in principle the price to pay for increasing the error correction capacity of the decoder.

In the case in which at least one of the two component codes of a product code is an algebraic geometric code, the present invention could thus advantageously be applied to the algorithms of correction with erasure which were designed for such codes (see for example the article by Tom Høholdt and Ruud Pellikaan entitled "*On the Decoding of Algebraic-Geometric Codes*", *IEEE Trans. Inform. Theory*, vol. 41 no. 6, pages 1589 to 1614, November 1995). It should be noted that for these algorithms, only a lower bound of their solving capability $\Delta$ is available, except in the "trivial" case of the maximal algorithm for correction of Reed-Solomon codes (called the "Berlekamp-Massey algorithm"), for which the solving capability is precisely known and is equal to $\Delta=n-k$. For example, the invention could be applied to the algorithm known as "Feng-Rao's algorithm", also called the "majority vote" algorithm, for which a safe value for the solving capability is $\Delta=n-k-g$. The so-called "basic" algorithm could also be used (see the article by A. N. Skorobogatov and S. G. Vladut, entitled "*On the Decoding of Algebraic-Geometric codes*", *IEEE Trans. Inform. Theory*, vol. 36 no. 5, pages 1051 to 1060, November 1990), for which a safe value for its solving capability is $\Delta=n-k-2g$.

It should be noted that, for the correction of an algebraic geometric code which is not a direct product component, this "basic" algorithm is simpler than the "Feng-Rao" algorithm but has less good performance. However, in the context of the present invention, it is in fact the basic algorithm which is preferred, for the reasons explained above.

Furthermore, the use of any one of these algorithms for decoding of algebraic geometric codes could be combined with known algorithmic improvements, such as that disclosed by the patent U.S. Pat. No. 6,138,263 mentioned above and which concerns the manner of proceeding at the start of correction of a received word having suffered multiple errors, or such as the "Berlekamp-Massey-Sakata acceleration" (see the articles by S. Sakata in *Symbolic Computing.*, vol. 5, pages 321 to 337, 1988, and in *Informat. Comput.*, vol. 84, pages 207 to 239, 1990).

Another example of an advantageous application of the invention is that of product codes in which at least one of the component codes is a "partial algebraic geometric code", as described in the article "*Partial Geometric Codes*" by O. Pretzel, *IEEE Trans. Inform. Theory*, vol. 45 no. 7, pages 2506 to 2512, 1999). This is a case of codes defined by means of curves whose genus is not precisely known, but for which "basic" and "majority vote" decoding algorithms exist that are analog to those mentioned above.

According to another of its aspects, the invention concerns various devices.

It thus concerns, firstly, an error correction device, said device being remarkable in that it comprises means for implementing any one of the decoding methods as described succinctly above.

The invention also concerns, secondly, a decoder comprising:
- at least one error correction device as described succinctly above, and
- at least one redundancy suppression device.

The invention also relates to:
- a device for receiving encoded digital signals comprising a decoder as succinctly described above, as well as means for receiving said encoded digital signals,
- a non-removable data storage device comprising computer program code instructions for the execution of the steps of any one of the methods succinctly described above,
- a partially or wholly removable data storage device comprising computer program code instructions for the execution of the steps of any one of the methods succinctly described above, and
- a computer program containing instructions such that, when said program controls a programmable data processing device, said instructions lead to said data processing device implementing one of the methods succinctly described above.

The advantages offered by these devices, data storage device and computer programs are essentially the same as those offered by the methods according to the invention.

Other aspects and advantages of the invention will emerge from a reading of the following detailed description of particular embodiments, given by way of non-limiting example. The description refers to the accompanying drawings.

DETAILED DESCRIPTION OF THE INVENTION

Figure 1:
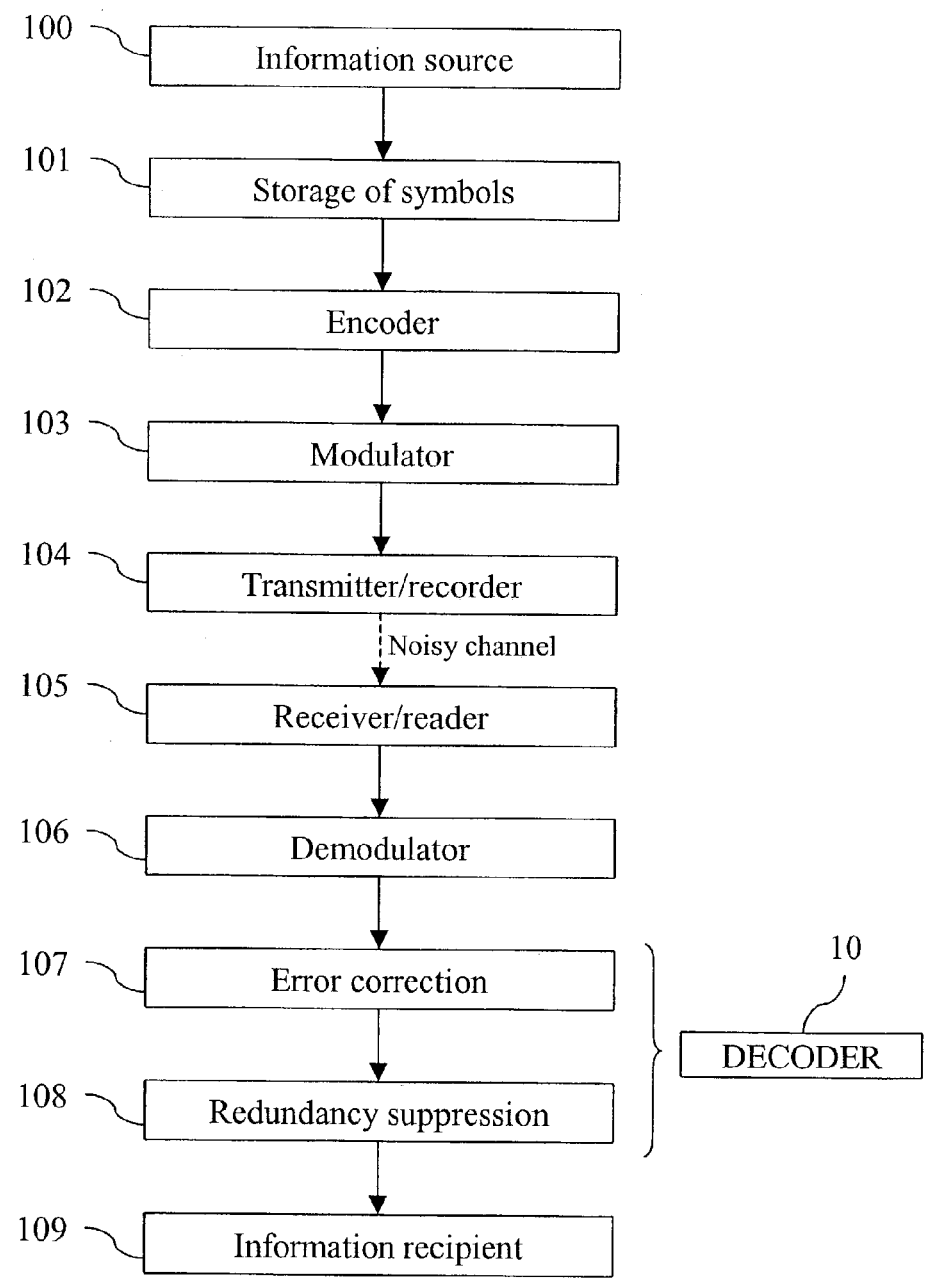
FIG. 1 is a block diagram of a system for transmitting information using a channel encoding according to the invention.

FIG. 1 is a block diagram of a system for transmitting information using a channel encoding according to the invention.

The function of this system is to transmit information of any nature from a source 100 to a recipient or user 109. First of all, the source 100 puts this information into the form of symbols belonging to a certain alphabet (for example quadruplets of bits), and transmits these symbols to a storage unit 101, which accumulates the symbols so as to form sets each containing $k_1 \cdot k_2$ symbols. Next, each of these sets is transmitted by the storage unit 101 to an encoder 102 which adds $(n_1 \cdot n_2 - k_1 \cdot k_2)$ redundant symbols to them, so as to build a word of product code in which each row is a word of length $n_1$ belonging to a first component code, and each column is a word of length $n_2$ belonging to a second component code (possibly identical to the first component code).

The words of product code so formed are next transmitted to a modulator 103, which associates a modulation symbol (for example, a complex amplitude) with each symbol of the word of product code. Next, these modulation symbols are transmitted to a transmitter or to a recorder 104, which inserts the symbols in a transmission channel. This channel may for example be constituted by a wired transmission or wireless transmission such as a radio signal, or by storage on an appropriate carrier such as a DVD or a magnetic tape. This transmission arrives at a receiver or a reader 105, after having been affected by a "transmission noise" whose effect is to modify or erase certain of the modulation symbols at random.

The receiver or reader 105 then transmits these symbols to the demodulator 106, which transforms them into symbols of the alphabet mentioned previously, of which each set constitutes a "received word". The received word is next processed by an error correction unit 107, which implements a decoding method according to the invention, so as to provide an "associated codeword" belonging to the product code. Next, this associated codeword is transmitted to a redundancy suppression unit 108, which extracts from it $k_1 \cdot k_2$ information symbols by implementing a decoding algorithm that is the reverse of that implemented by the encoder 102. Finally, these information symbols are supplied to their recipient 109.

Units 107 and 108 can be considered to form conjointly a "decoder" 10.

Figure 2:
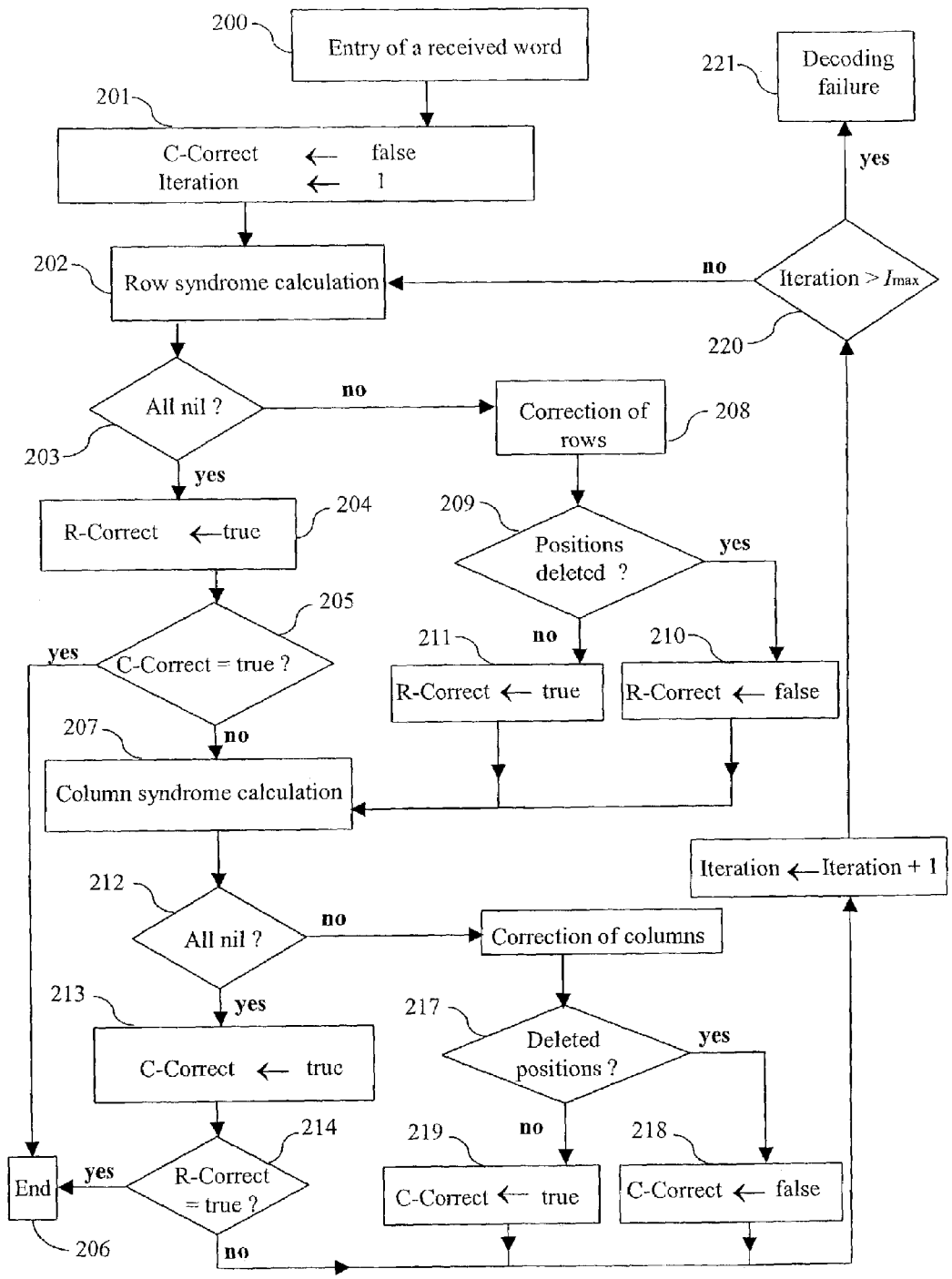
FIG. 2 is a flow chart representing the main steps of a method of correcting errors in a received word.

FIG. 2 is a flow chart representing the main steps of an error correction method according to the invention, which is implemented each time the error correction unit 107 takes a new received word (in the form of a table of symbols belonging to said alphabet) at step 200 of this method.

The method comprises at least one iteration, with a maximal number of iterations $I_{max}$ fixed in advance, by precaution, to avoid the risks of endless loops. Each iteration itself comprises an attempt at correction of the rows, followed by an attempt at correction of the columns. A logic variable called R-correct receives the value true when the row correction algorithm $A_1$ has found that all the rows of the table are codewords of the first component code; so long as this is not the case, the variable R-correct receives the value false. Similarly, a logic variable called C-correct receives the value true when the column correction algorithm $A_2$ has found that all the columns of the table are codewords of the second component code; so long as this is not the case, the variable C-correct receives the value false.

At step 201, the variable C-correct is initialized to false, and the iteration counter is initialized to zero. A step 202, the algorithm $A_1$ calculates the error syndromes of the rows of the table.

If, at step 203, it is found that the syndromes are all nil, it is thereby deduced that the rows are all words of the first component code, and consequently the variable R-correct receives the value true at step 204. It is next verified, at step 205, whether the value of C-correct is equal to true. If this is the case, it is thereby deduced that the correction of the received word has terminated, and, at the final step 206, the error correction unit 107 transmits the table of symbols, which now constitutes the "associated codeword", to the redundancy suppression unit 108. However, if at step 205 the value of C-correct proves to be equal to false, calculation of the error syndromes of the columns of the table by the algorithm $A_2$ is proceeded with at step 207.

If, on the other hand, it is found at step 203 that certain row error syndromes are not nil, at step 208 the method of attempting correction according to the invention described above with reference to FIG. 3a is applied to the corresponding rows. It is next verified, at step 209, whether certain positions of the table remain erased. If this is the case, the variable R-correct receives the value false at step 210, otherwise the variable R-correct receives the value true at step 211. After step 210, or else step 211, the step 207, already mentioned, is proceeded to.

If, at step 212, it is found that the column error syndromes are all nil, it is thereby deduced that the columns are all words of the second component code, and consequently the variable C-correct is given the value true at step 213. It is next verified, at step 214, whether the variable C-correct is equal to true. If this is the case, it is deduced from this that the correction of the received word has terminated and the final step already mentioned is proceeded to. Otherwise, the iteration counter is incremented at step 215.

If, on the other hand, it is found at step 212 that certain column error syndromes are not nil, at step 216 the method of attempting correction according to the invention described above with reference to FIG. 3b is applied to the corresponding columns. It is next verified, at step 217, whether certain positions of the table remain erased. If this is the case, the variable C-correct receives the value false at step 218, otherwise the variable C-correct receives the value true at step 219. After step 218, or else step 219, the step 215, already mentioned, is proceeded to.

After step 215, it is verified at step 220 whether a number of iterations has already been carried out which is equal to the maximal number $I_{max}$ provided for. If this is not the case, step 202 is returned to for a new iteration. However, if this is the case, it is considered that the attempt at correction of the received word has failed, and the method is interrupted at step 221; what to do in these cases of correction failure is not a matter concerned by the method according to the invention, and must be agreed on in advance by the users of the method.

Figure 3A:
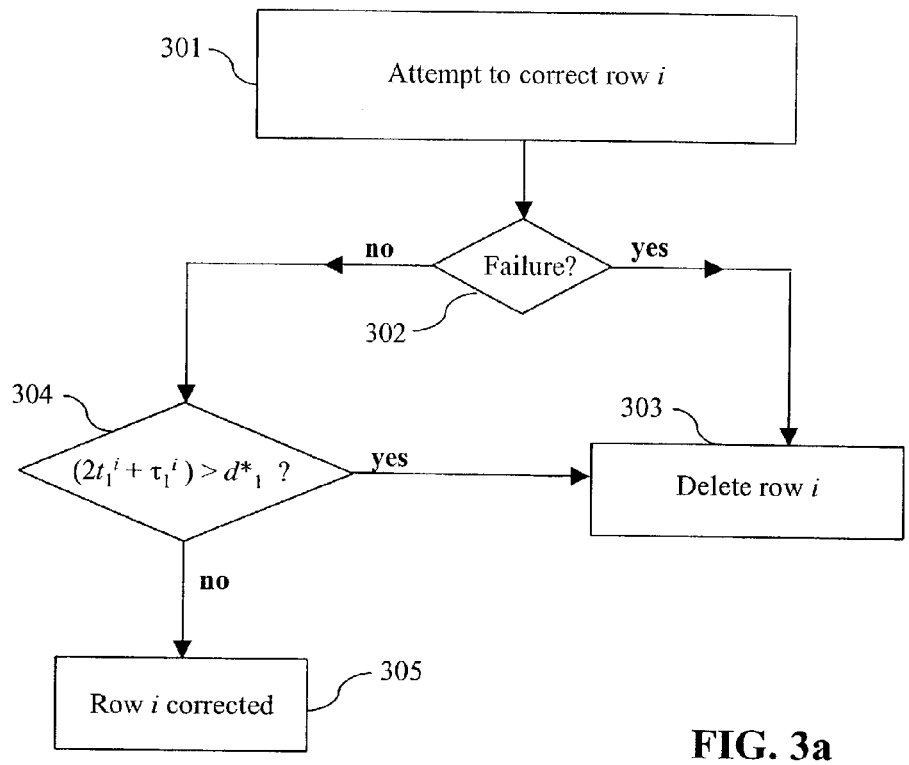
FIG. 3a is a flow chart representing the main steps of a method of attempting to correct errors, this method forming part of a step of the method shown in FIG. 2.

FIG. 3a is a flow chart representing the main steps, according to the invention, of a method of attempting to correct errors contained in a row $i(1 \leq i \leq n_2)$ of the symbol table processed by the unit 107. The successive applications of this method to all the rows of the table conjointly form step 208 of the method described above with reference to FIG. 2.

At step 301, the algorithm $A_1$ attempts to correct row i on the basis of the error syndromes taking into account, if appropriate, of the $\tau_1^i$ positions erased from that row.

If, at step 302, it is found that algorithm $A_1$ does not manage to correct that row, i.e. to propose a corresponding word forming part of the first component code, then row i is entirely erased at step 303.

If, on the other hand, at step 302, the algorithm $A_1$ proposes a corresponding word forming part of the first component code, then, at step 304; the number $t_1^i$ of symbols in that row are counted that have been modified by the algorithm (and which were not located in erased positions), then the number $(2t_1^i + \tau_1^i)$ is calculated and its value is compared with a predetermined number $d^*_1$.

If, at the issue of step 304, $(2t_1^i + \tau_1^i)$ proves to be greater than $d^*_1$, then row i is entirely erased at the step 303 already mentioned.

If, on the other hand, $(2t_1^i + \tau_1^i)$ proves to be less than or equal to $d^*_1$, then at step 305 the correction of the row i which has just been carried out by the algorithm $A_1$ is accepted.

Figure 3B:
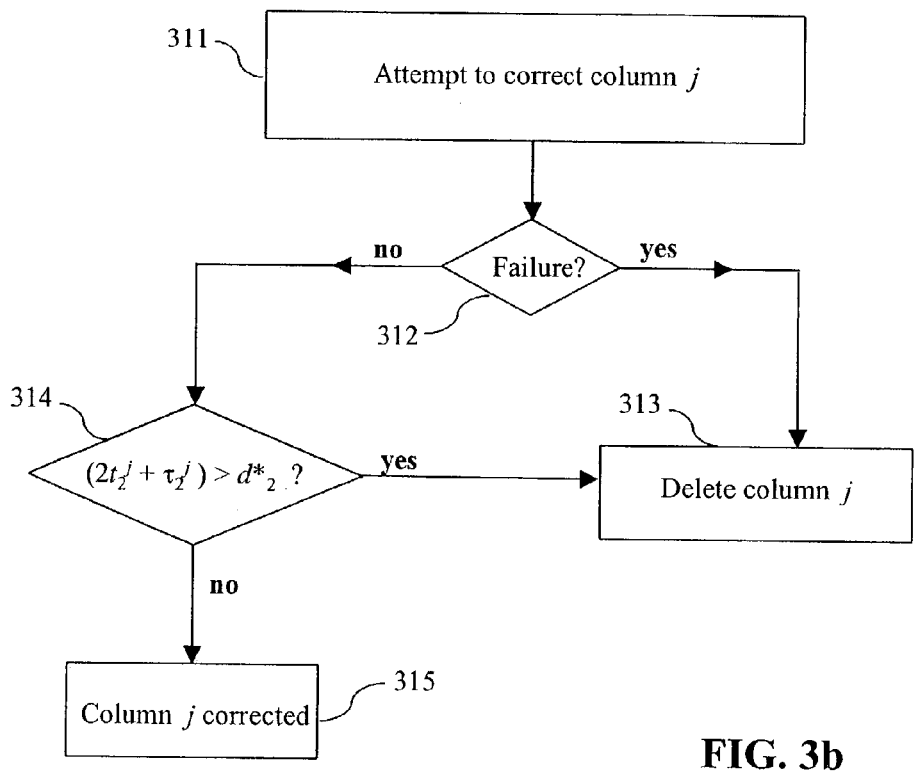
FIG. 3b is a flow chart representing the main steps of a method of attempting to correct errors, this method forming part of another step of the method shown in FIG. 2, FIGS. 4a to 6b show an digital example of implementation of the method shown in FIG. 2.

Similarly, FIG. 3b is a flow chart representing the main steps, according to the invention, of a method of attempting to correct errors contained in a column $j(1 \leq j \leq n_1)$ of the symbol table processed by the unit 107. The successive applications of this method to all the columns of the table conjointly form step 216 of the method described above with reference to FIG. 2.

The steps 311 to 315 appearing in FIG. 3b are entirely similar, respectively, to steps 301 to 305 of FIG. 3a.

The method of error correction according to the invention will now be illustrated, with the aid of a digital example, and on the basis of FIGS. 4a to 6b. Note that this example does not necessarily constitute a preferred choice of parameters for the encoding or decoding. It is provided here to enable the person skilled in the art to understand more easily the operation of the method according to the invention.

Consider thus a product code whose component codes are algebraic geometric codes constructed on $F_{16}$ on the basis of a maximal elliptic curve with 24 points (for example: $y^2+y=x^3+x$), of genus: g=1. The parameters (n,k) of these codes are respectively taken equal to:

$n_1=24, k_1=20; n_2=24, k_2=18$.

Furthermore, the "basic algorithm" is chosen for the two algorithms $A_1$ and $A_2$. Thus the respective solving capabilities are:

$\Delta_1=n_1-k_1-2g=2, \ et \ \Delta_2=n_2-k_2-2g=4$.

Finally:

$d^*_1=\Delta_1$, and $d^*_2=\Delta_2$ are taken as reliability limits, such that $A_1$ may, in a reliable manner, correct 1 error or determine the value of 2 erased positions, and such that $A_2$ may, in a reliable manner, correct 2 errors, or correct 1 error and determine the value of 2 erased positions, or else determine the value of 4 erased positions.

In FIGS. 4a to 6b, the erroneous positions of the symbol table (i.e. the positions each containing a different symbol to the corresponding transmitted symbol) are represented by x's. FIG. 4a represents the received word itself, in the form it issued from the demodulator 106. It can be seen that it suffers from a certain number of transmission errors, which affect rows 3, 6, 9, 10, 14 and 16.

FIG. 4b shows the state of the symbol table after a first application of the algorithm $A_1$. The simple errors of rows 10 and 16 have been corrected. It has not been possible to correct rows 6 and 9, which contained many errors, and the symbols they contained have been erased, which is represented by a grayed zone in that Figure and in the following Figures.

Row 3 also contained a high number of transmission errors (four); despite this, algorithm $A_1$ was able to propose a "corrected" codeword; all it had to do for this was to change, in row 3, the value of a single symbol, which was that situated in column 10, and consequently row 3 has not been erased. However, this symbol, as well as those situated in columns 5, 6, and 12, are in fact erroneous.

Finally, row 14 also contained a high number of transmission errors (five); despite this, algorithm $A_1$ was above to propose a "corrected" codeword; all it had to do for this was to change, in row 14, the value of a single symbol, which was that situated in column 15, (which was in fact correct in the received word !) and consequently row 14 has not been erased. This symbol, as well as those situated in columns 6, 7, 8, 9 and 10 are thus, at this stage, erroneous.

Figure 5B:
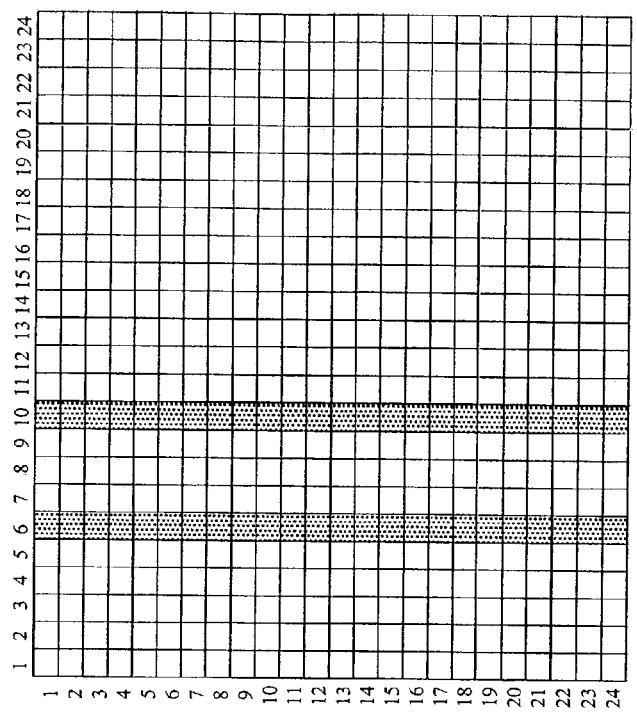
Figure 5B:
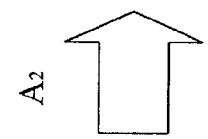
Figure 5A:
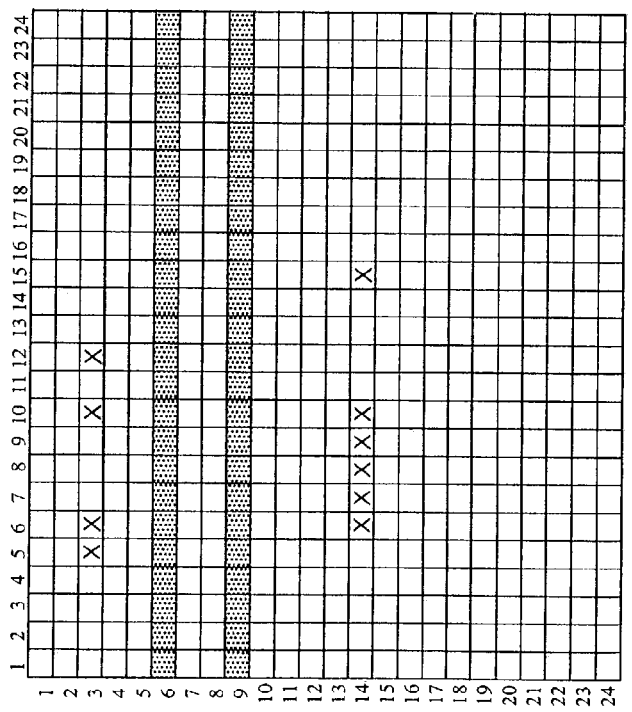

FIG. 5a repeats FIG. 4b. FIG. 5b shows the state of the symbol table after a first application of the algorithm $A_2$ (which completes the first iteration of the method). It can be seen that all the columns have been corrected, with the exception of columns 6 and 10, which have been erased since algorithm $A_2$ was unable to correct them.

Figure 6B:
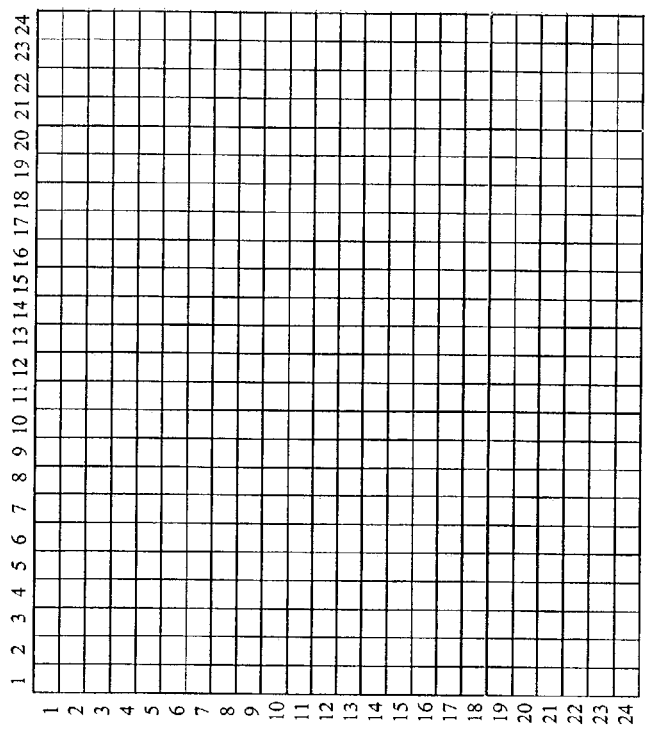
Figure 6A:
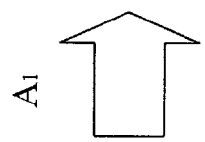
Figure 6A:
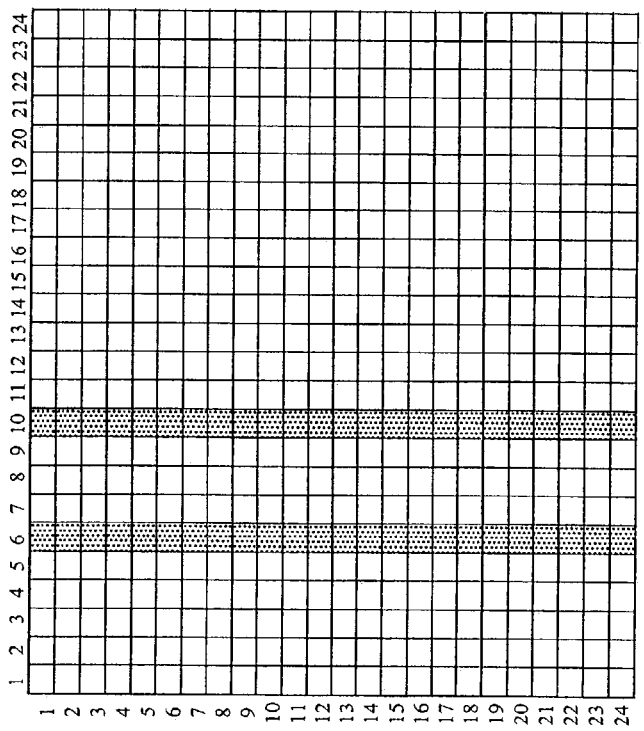

FIG. 6a repeats FIG. 5b. FIG. 6b shows that after a second application of algorithm $A_1$, all the errors initially contained in the received word have been corrected. The associated codeword represented in FIG. 6b is thus identical to the corresponding transmitted word, and it only remains to unit 108 to erase the redundant symbols so that unit 109 can retrieve the information symbols which were destined for it.

The method of error correction according to the invention was described above in general terms on the basis of FIGS. 2 to 6b. However, it should be noted here that the application of this method proves to be particularly efficient if "sub-maximal" algorithms are chosen for $A_1$ and $A_2$: this is because, as explained in the introduction, these algorithms are generally simple to implement, and execute rapidly. It is true that if the received word suffers from a large number of transmission errors, the fact that said algorithms have a relatively low solving capability could, at the first processing steps, cause a high number of erasures, but the method of the invention guarantees that the non-erased symbols of the word processed will almost all be correct after these initial steps; from then on the processing of this word will thus be terminated both reliably and rapidly (except, of course, if the number of transmission errors is so great that any reasonable attempt at correction of the received word is impossible, but in that case the use of maximal algorithms would also result in a correction failure, or, which is no doubt even worse, in an erroneous associated codeword).

As an option, the final steps of correction according to the invention could, furthermore, be rendered still more rapid, by somewhat increasing, during final processing, the value of the reliability limit $d^*_1$ and/or the reliability limit $d^*_2$.

Figure 7:
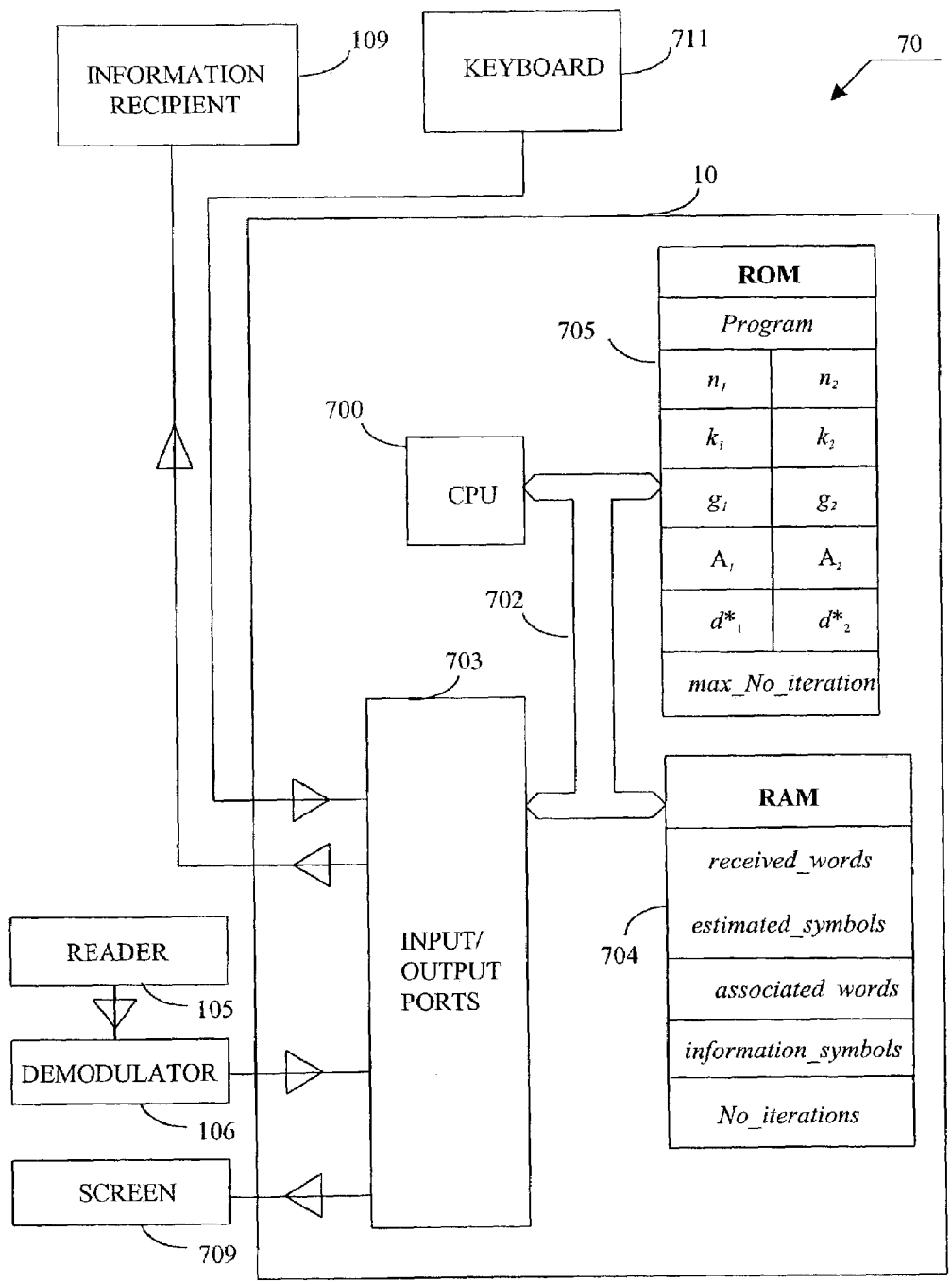
FIG. 7 shows an apparatus for receiving digital signals incorporating a decoder according to the invention.

The block diagram of FIG. 7 represents an apparatus for reception of digital signals 70 incorporating the decoder 10, and adapted for an application in which the channel code used is a product code whose components are for example both algebraic geometric codes. This apparatus 70 comprises a keyboard 711, a screen 709, a recipient of external information 109, a data reader 105 and a demodulator 106, conjointly connected to input/output ports 703 of the decoder 10 which is produced here in the form of a logic unit.

The decoder 10 comprises, connected together by an address and data bus 702:
  a central processing unit 700,
  a random access memory (RAM) 704,
  read only memory (ROM) 705; and
  said input/output ports 703.

Each of the elements illustrated in FIG. 7 is well known to the person skilled in the art of microcomputers and mass storage systems and, more generally, of information processing systems. These known elements are therefore not described here. It should be noted, however, that:
  the information recipient 109 could, for example, be an interface peripheral, a display, a modulator, an external memory or other information processing system (not shown), and could be adapted to receive sequences of signals representing speech, service messages or multimedia data in particular of the IP or ATM type, in the form of sequences of binary data,
  the reader 105 is adapted to read data recorded on a carrier such as a magnetic or magneto-optic disk.

The random access memory 704 stores data, variables and intermediate processing results, in memory registers bearing, in the description, the same names as the data whose values they store. The random access memory 704 contains in particular the following registers:
  registers "received_words", in which the received words are kept,
  a register "estimated_symbols", in which are stored the symbols of the table from a received word in course of correction,
  a register "associated_words", in which are stored the tables of symbols of the "associated codewords",
  a register "information_symbols", in which are stored the symbols resulting from the redundancy suppression, and
  a register "No_iterations", in which is stored the value of the number of iterations already made by the decoder in course of correction of a received word.

The read only memory 705 is adapted to store, in registers which, for convenience, have the same names as the data which they store:
  the operating program of the central processing unit 700, in a register "program",
  the length of the words of the first component code in a register "$n_1$",
  the length of the words of the second component code in a register "$n_2$",
  the number of information symbols in the words of the first component code, in a register "$k_1$",
  the number of information symbols in the words of the second component code, in a register "$k_2$",
  the genus of the algebraic curve chosen for the first code, in a register "$g_1$",
  the genus of the algebraic curve chosen for the second code, in a register "$g_2$",
  the algorithm for correction with erasures chosen for the first component code, in a register "$A_1$",
  the algorithm for correction with erasures chosen for the second component code, in a register "$A_2$",
  the reliability limit for the first algorithm, in a register "$d^*_1$",
  the reliability limit for the second $d^*_1$ algorithm, in a register "$d^*_1$", and
  the maximal number of iterations $I_{max}$ in a register "max_No_iteration".

An application of the invention to the mass storage of data has been described above by way of example, but it is clear that the methods according to the invention may equally well be implemented within a telecommunications network, in which case unit 105 could for example be a receiver adapted to implement a protocol for data packet transmission over a radio channel.

The invention claimed is:

1. A decoding method, implemented by executing a program embedded in a computer readable medium, of decoding a product code, in which symbols of each codeword are placed in a table comprising $n_2$ rows and $n_1$ columns, such that the symbols constituting each row form a permitted word of length $n_1$ according to a first component code to be decoded by means of an algorithm $A_1$ for correction with erasures, and the symbols constituting each column form a permitted word of length $n_2$ according to a second component code to be decoded by means of an algorithm $A_2$ for correction with erasures, said method being characterized in that it comprises a succession of main steps which are implemented until the correction of the received word is complete, each of these steps consisting in processing either a row or a column of said table in a predetermined order, and in that it comprises, to process a row i ($1 \leq i \leq n_2$):
- a) applying the algorithm $A_1$ to the row i taking into account the $\tau_1^i$ erased positions (if any),
- b) if the algorithm $A_1$ is unable to correct the row, erasing all the symbols of that row,
- c) if the algorithm $A_1$ is able to correct the row, counting the number $t_1^i$ of symbols whose value has been changed during the correction in the row to be corrected and of which it was not known in advance that they were to be corrected, and determining whether the result of this correction is reliable on the basis of the value of $t_1^i$ and of the number $\tau_1^i$ of erased symbols in this row and, if the result is deemed reliable, accepting said correction,
if the result is not deemed reliable, erasing all the symbols of that row, and in that it comprises, to process a column j ($1 \leq j \leq n_1$):
- d) applying the algorithm $A_2$ to the column j taking into account the $\tau_2^j$ erased positions (if any),
- e) if the algorithm $A_2$ is unable to correct the column, erasing all the symbols of that column,
- f) if the algorithm $A_2$ is able to correct the column, counting the number $t_2^j$ of symbols whose value has been changed during the correction in the column to be corrected and of which it was not known in advance that they were to be corrected, and determining whether the result of this correction is reliable on the basis of the value of $t_2^j$ and of the number $\tau_2^j$ of erased symbols in this column and, if the result is deemed reliable, accepting said correction,
if the result is not deemed reliable, erasing all the symbols of that column.

2. The decoding method according to claim 1, comprising in step c), counting the number $t_1^i$ of symbols whose value has been changed during step a), then calculating the value $(2t_1^i+\tau_1^i)$, and if $(2t_1^i+\tau_1^i) \leq d^*_1$, where $d^*_1$ is a predetermined positive integer, accepting the correction, and if $(2t_1^i+\tau_1^i) > d^*_1$, erasing all the symbols of that row, and in step f), counting the number $t_2^j$ of symbols whose value has been changed during step d), then calculating the value $(2t_2^j+\tau_2^j)$, and if $(2t_2^j+\tau_2^j) \leq d^*_2$, where $d^*_2$ is a predetermined positive integer, accepting the correction, and if $(2t_2^j+\tau_2^j) > d^*_2$, erasing all the symbols of that column.

3. The decoding method according to claim 2, characterized in that the value of $d^*_1$ and/or $d^*_2$ is made to vary during the decoding of a received word.

4. The decoding method according to claim 1, characterized in that said first component code and/or said second component code is an algebraic geometric code.

5. The decoding method according to claim 1, characterized in that said algorithm $A_1$ and/or said algorithm $A_2$ is a "sub-maximal" algorithm.

6. The decoding method according to claim 4 or claim 5, characterized in that at least one of the decoding algorithms $A_1$ and $A_2$ is the "basic" algorithm.

7. An error correction device, characterized in that it comprises means for implementing a decoding method according to claim 1.

8. A decoder, characterized in that it comprises:
at least one error correction device according to claim 7, and
at least one redundancy suppression device.

9. An apparatus for receiving encoded digital signals, characterized in that it comprises a decoder according to claim 8, and in that it comprises means for receiving said encoded digital signals.

10. A non-removable data storage device, characterized in that it comprises computer program code instructions for the execution of the steps of a method according to claim 1.

11. A partially or wholly removable data storage device, characterized in that it comprises computer program code instructions for the execution of the steps of a method according to claim 1.

12. A computer program stored on a computer readable medium, the program characterized in that it contains instructions such that, when said program controls a programmable data processing device, said instructions lead to said data processing device implementing a method according to claim 1.

* * * * *

UNITED STATES PATENT AND TRADEMARK OFFICE
CERTIFICATE OF CORRECTION

PATENT NO. : 7,120,850 B2
APPLICATION NO. : 10/408458
DATED : October 10, 2006
INVENTOR(S) : Frederic Lehobey et al.

It is certified that error appears in the above-identified patent and that said Letters Patent is hereby corrected as shown below:

COVER PAGE:
(54) Title "LOW-COST METHODS AND DEVICES FOR THE DECODING OF PRODUCT CASES" should read -- LOW-COST METHODS AND DEVICES FOR THE DECODING OF PRODUCT CODES --.

COLUMN 1:
Line 2, "CASES" should read -- CODES --.

COLUMN 5:
Line 58, "par" should be deleted.

COLUMN 6:
Line 65, "analog" should read -- analogous --.

COLUMN 10:
Line 31, "*et*" should read -- and --.

Signed and Sealed this

Third Day of July, 2007

JON W. DUDAS
*Director of the United States Patent and Trademark Office*